(12) United States Patent
Putzi

(10) Patent No.: US 7,270,510 B2
(45) Date of Patent: Sep. 18, 2007

(54) DEVICE AND METHOD FOR TRANSPORTING WAFER-SHAPED ARTICLES

(75) Inventor: Christian Putzi, Villach (AT)

(73) Assignee: SEZ AG, Villach (AT)

( * ) Notice: Subject to any disclaimer, the term of this patent is extended or adjusted under 35 U.S.C. 154(b) by 32 days.

(21) Appl. No.: 10/531,419

(22) PCT Filed: Oct. 9, 2003

(86) PCT No.: PCT/EP03/11178

§ 371 (c)(1),
(2), (4) Date: Apr. 15, 2005

(87) PCT Pub. No.: WO2004/036628

PCT Pub. Date: Apr. 29, 2004

(65) Prior Publication Data

US 2006/0008342 A1  Jan. 12, 2006

(30) Foreign Application Priority Data

Oct. 16, 2002  (AT) .............................. A 1565/2002

(51) Int. Cl.
*B65G 37/00* (2006.01)
(52) U.S. Cl. .......................... 414/226.05; 414/222.01; 414/416.03; 414/416.08; 414/941

(58) Field of Classification Search ................ 414/937, 414/935, 938, 941, 416.03, 416.08, 222.01, 414/226.05, 280, 283
See application file for complete search history.

(56) References Cited

U.S. PATENT DOCUMENTS

| | | | |
|---|---|---|---|
| 4,981,408 A | 1/1991 | Hughes et al. | |
| 5,442,416 A | 8/1995 | Tateyama et al. | |
| 6,156,580 A * | 12/2000 | Wooten et al. | 438/16 |
| 6,318,951 B1 * | 11/2001 | Schmidt et al. | 414/744.5 |
| 6,488,462 B1 * | 12/2002 | Williams | 414/277 |
| 2002/0071756 A1 * | 6/2002 | Gonzalez | 414/941 |
| 2002/0078892 A1 | 6/2002 | Takahashi | |
| 2002/0102155 A1 * | 8/2002 | Wu et al. | 414/744.5 |
| 2003/0091410 A1 * | 5/2003 | Larson et al. | 414/217 |

FOREIGN PATENT DOCUMENTS

| | | |
|---|---|---|
| JP | 10-22359 | 1/1998 |
| JP | 2000-49206 | 2/2000 |
| JP | 2001-274232 | 10/2001 |

* cited by examiner

*Primary Examiner*—Donald Underwood
(74) *Attorney, Agent, or Firm*—Young & Thompson

(57) ABSTRACT

An apparatus for treating wafer-shaped articles includes at least one linear arranged array of a plurality of at least two process units wherein in each such process unit one single wafer-shaped article can be treated, a cassette-holding unit for holding at least one cassette storing at least one wafer-shaped article therein and a transport system for picking a wafer-shaped article from a cassette and placing it into one of a process unit. The apparatus has a transport unit movably mounted on a linear track. The transport unit includes at least one holding member for holding a single wafer-shaped article in a substantially vertical plane parallel to the linear track.

4 Claims, 1 Drawing Sheet

DEVICE AND METHOD FOR
TRANSPORTING WAFER-SHAPED
ARTICLES

BACKGROUND OF THE INVENTION

The invention relates to a device and a method for transporting wafer-shaped articles for placing wafer-shaped articles into and pick wafer-shaped articles from process units of an apparatus having a plurality of at least two process units aligned in at least one array.

BRIEF DESCRIPTION OF THE RELATED ART

Known in the art there are very many different concepts of transport paths (e.g. WO97/11623 A1, U.S. Pat. Nos. 5,919,529 A1, 5,788,868 A1, 5,518,542A1, A1). All these transport systems have in common that the wafer-shaped article is moved in a horizontal state. Herein horizontal state means that the main surface plane of the wafer-shaped article lies in a substantially horizontal plane.

SUMMARY OF THE INVENTION

An object of the invention is to provide a transport system for an apparatus having a plurality of at least two process units that allows a higher through put of articles per foot print or a lower footprint with the same through put.

The invention meets the objects by providing an apparatus for treating wafer-shaped articles comprising at least one linear arranged array of a plurality of at least two process units wherein in each such process unit one single wafer-shaped article can be treated, a cassette-holding unit for holding at least one cassette storing at least one wafer-shaped article therein and a transport system for picking a wafer-shaped article from a cassette and placing it into one of a process unit. The transport system comprises at least one linear track arranged parallel to the at least one array of the plurality of process units for moving at least one single wafer-shaped article along a linear path parallel to the array of the plurality of process units. The apparatus further comprises a transport unit movably mounted on each of said at least one linear track. Said transport unit comprising at least one holding means for holding a single wafer-shaped article in a substantially vertical plane parallel to the linear track.

The transport unit can be moved indirectly on the linear track by a ball screw or a tooth belt driven by a stepper motor. Or it can be directly moved by an electrical linear motor.

An advantage of the invention is that the width of the transport path for transporting the wafer-shaped article can be selected much smaller than the smallest diameter of the wafer-shaped article. For instance typically for transporting a 300 mm wafer a path width of at least 320 mm is needed, with a transport system of the current invention the with of the transport path can be reduced to about 60 mm. Provided a machine of a length of about 5 m length with one transport path there along a foot print of about 1.2 m² can be saved. If such a machine had two or three parallel transport paths 2.4 or 3.6 m² could be saved.

Optionally the apparatus has a transport unit with a pivoting mechanism for pivoting the wafer-shaped article from a substantially vertical state to a substantially horizontal state. This is useful if the wafer-shaped articles are stored and/or treated in a horizontal state. Thus in the process units might comprise holding means for holding the wafer-shaped article in a substantially horizontal state.

An advantageous apparatus comprises a front unit wherein an array of at least two cassette-holding units for holding cassettes storing a plurality of wafer-shaped articles is arranged and a transfer unit for transferring the wafer-shaped article between the cassette and the transport unit of the at least one linear track. Such a transfer unit can be a robot with an end effector being thin enough to access a cassette between two wafer-shaped articles stored therein in order to pick one wafer-shaped article.

In another embodiment the apparatus comprises at least one transfer station for temporarily storing the wafer-shaped article, the transfer station being accessible by the transport unit movably mounted on the linear track and by the transfer unit. This intermediate storing gives the advantage that the transfer unit getting the wafer-shaped articles from the cassette and the transport unit delivering the wafer-shaped articles to the process units may act more or less independently from each other.

If the transfer station comprises a flip mechanism for flipping the wafer-shaped article it has the additional advantage that either the front or the backside of a wafer-shaped article might be treated no matter which side is up in the cassette.

Yet another embodiment has a transfer station comprising two holding devices arranged in a back-to-back configuration. Thus one transfer station is able to hold two wafer-shaped articles at one time.

It is useful if a transport unit comprises a flip mechanism for flipping the wafer-shaped article and two holding means preferably arranged in a back-to-back configuration.

In a preferred embodiment the apparatus has a transport system comprising at least two of said at least one linear tracks. In such a case the left track typically delivers wafer-shaped articles to process units on the left side of the apparatus and the right track to the process units oh the right side. If there was a third linear track in the middle between the left and the right linear track that third track could deliver wafer-shaped articles to both sides.

Further details and advantages of the invention can be realized form the detailed description of a preferred embodiment.

DESCRIPTION OF THE PREFERRED EMBODIMENTS

Figure 1:
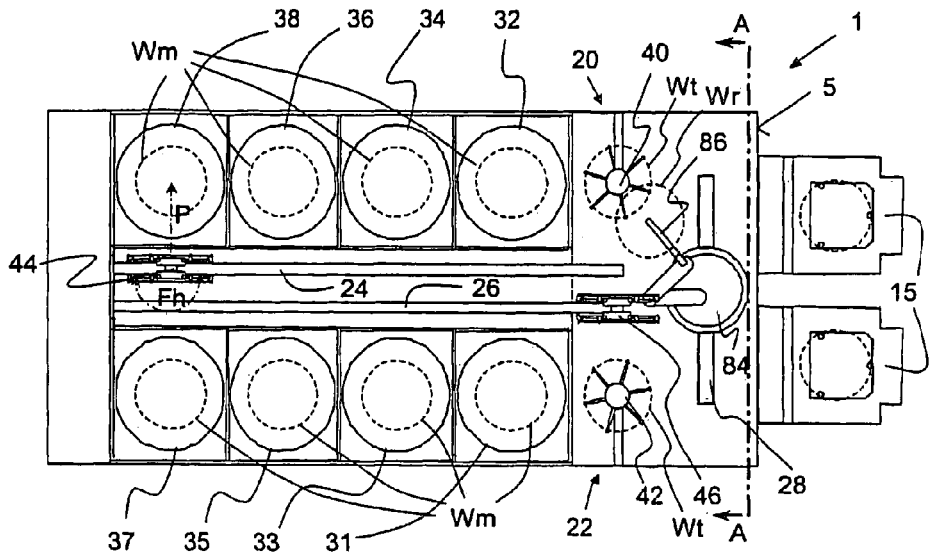
FIG. 1 shows a schematic top view of an Apparatus for treating wafer-shaped articles according to an advantageous embodiment of the present invention.

The apparatus 1 has a first linear arranged array of a plurality of four process units 31, 33, 35, 37 and a second linear arranged array of a plurality of another four process units 32, 34, 36, 38. In each such process unit one single wafer (Wm) can be treated in a horizontal position. The process units shown in this embodiment can be selected from wet spin treating units, spin coating units, temperature treating units or any other single wafer process unit. The lines, in which the arrays of the plurality of said process units 31-38 are arranged, are substantially perpendicular to the front plane 5. In this front plane 5 two cassette-holding units 15 for holding at least one cassette storing at least one wafer-shaped article therein. In this case each cassette-holding unit 15 is a front opening unified port (FOUP).

The apparatus 1 has a transport system for picking a wafer from a cassette on the FOUP 15 and placing it into one of a process unit 31-38.

The transport system includes two linear tracks 24 and 26 arranged parallel to the array of the plurality of process units for moving at least one single wafer along a linear path parallel to the array of the plurality of process units. Wm indicates the position of a wafer during processing in a process module (process unit). One transport unit 44, 46 is movably mounted on each linear track 24, 26. Each transport unit 44, 46 has two holding means 44a, 44b and 46a, 46b respectively. The two wafer holding devices are arranged parallel two each other in a back-to-back configuration. The transport system is arranged for holding single wafers in a substantially vertical plane, which is parallel to the linear track 24, 26. Therefore the transport path is narrower than the diameter of a wafer.

Each holding means is a gripper, which contacts the wafer on the wafer edges only (edge contact only=ECO). Such a gripper (called ECO-gripper) is state-of-the-art and therefore for further details it shall be referred to the U.S. Pat. Nos. 05,762,391A, 05,931,518A or 06,109,677A. Alternatively holding means based on the Bernoulli principle can be used as disclosed in U.S. Pat. Nos. 05,967,578A or 06,152,507A. Even simple vacuum grippers are applicable.

To bring the holding means and the wafers therewith from the vertical position into a horizontal position each transport unit 44 and 46 further comprises a pivoting mechanism 64, 66. The pivoting mechanisms 64 and 66 shown in FIG. 2 each have one stepper motor and an associated gear. Motor and gear are both well known in the art. The turning movement P in this embodiment is carried out around an axis substantially parallel to the transport path 24 or 26 respectively. The pivoting mechanism rotates the holding means by about 90° to bring the wafer from a vertical to a horizontal position. The side of the wafer that faces the process module is thus faced downwards when laid onto or into the process module.

An alternative pivoting mechanism (not shown) can carry out a turning movement around an axis, which is perpendicular to the transport path and in an angle of 45° to the horizontal plane. In this case the pivoting mechanism rotates the holding means by about 180° to bring the wafer from a vertical to a horizontal position. The side of the wafer that faces the process module is thus faced upwards when laid onto or into the process module.

Figure 2:
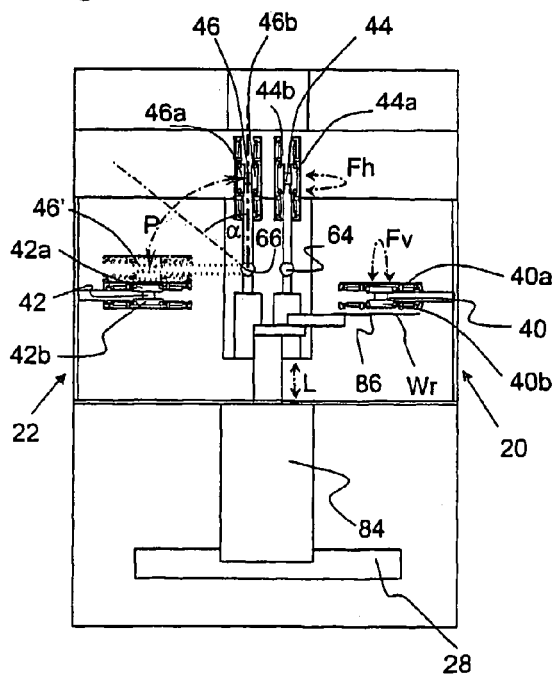
FIG. 2 shows a sectional view according to FIG. 1 along line A-A.

Each transport unit 44, 46 shown in FIGS. 1 and 2 further comprises a flip module so that the holding means 44a, 44b and 46a, 46b respectively can change places. Thus a holding device, which does not face the process module, can alter its position so that it faces the process module and therefore a wafer carried by this holding device can be placed onto that process module. To avoid collision of one transport unit 46 with a transport unit 44 on the other linear track it is advantageous to pivot the holding means 46 with pivoting mechanism 66 about an angle α (e.g. 45°, see FIG. 2), then to flip the holding means 46a, b and at least to further pivot into position 46' (dotted lines).

Between the cassette-holding unit 15 and the linear tracks 24, 26 transfer stations 20, 22 are arranged. The left linear track 26 is associate with the left transfer station 22 and the right linear track 24 is associate with the right transfer station 20. Each transfer station 20, 22 is arranged so that the corresponding wafer transport unit 44, 46 can pick a wafer from and place a wafer onto the transfer station. For simplification reasons the transfer stations are arranged in a line with the respective array of process units. Thus each transfer station is easy accessible for the respective holding device.

Figure 3:
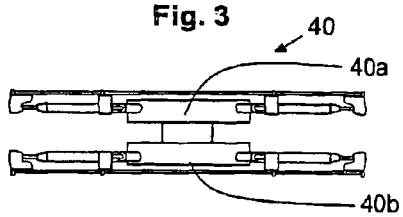
FIG. 3 shows a side view of an embodiment of the holding means use in the present invention.
Figure 4:
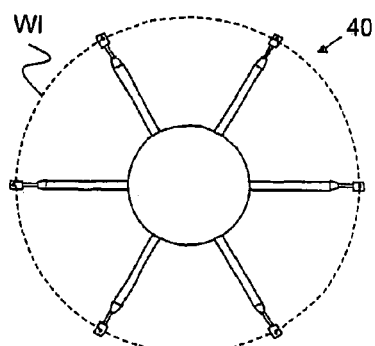
FIG. 4 shows a top view of the holding means according to FIG. 3.

As shown in FIGS. 1 and 2 each transfer station 20, 22 comprises a holding unit 42, 40. Each holding unit 40, 42 of the transfer station is equipped with two wafer holding devices 40a, 40b and 42a, 42b respectively. The holding devices are arranged parallel two each other and in a back-to-back configuration as can be seen in FIG. 3 and 4.

Between the cassette-holding unit 15 and the transfer stations 20, 22 a robot 84 is arranged. The robot 84 comprises a moving arm with an end effector 86 mounted on its peripheral end for transporting a wafer Wr. End effectors for transporting wafers are well known in the art and therefore not described in details herein. The robot 84 with its end effector 86 is configured in a way to pick and place wafers in a cassette carried by on of the cassette-holding units 15 and to pick and place wafers on one of the transfer stations 20, 22. For an access to cassettes on both cassette-holding units the robot 84 is mounted on a linear track 28 parallel to the front plane 5. The robot can further fulfill a lifting movement indicated by the arrow L (FIG. 2).

In another embodiment (not shown) a robot is used being able to access cassettes carried by several parallel arranged cassette-holding units. In such a case there is no need of a linear track.

Alternatively a double arm robot can be used. In this case a first end effector can pick a first wafer from a certain place and second arm can deliver a second wafer onto the same place immediately thereafter.

The holding unit 40, 42 of the transfer station is further equipped with a flip module to flip a low wafer up and vice versa indicated by the arrow Fv (FIG. 2). This flip module gives the choice either to treat the selected side of a wafer. For explanation purposes a first side of a wafer is called side A and the opposite side of the wafer shall be called side B.

Suggested that side A faces upward in the cassette and side A shall face upward during treatment in the process unit the movement of the wafer through the machine occurs as follows. The robot 84 collects the wafer from a cassette and delivers it to the upper holding device 40a of the transfer station 20. The transport unit 44 is linearly moved close to the transfer station 20 and is pivoted so that its holding device 44a can collect the wafer from holding device 40a. Then the wafer is delivered to the process unit as above described.

If side B shall face upward during treatment in the process unit robot 84 collects the wafer from a cassette and delivers it to the lower holding device 40b of the transfer station 20. Then the holding device 40 is flipped so that the wafer gets into the upper position 40a and therefore side B faces upward.

In another embodiment (not shown) the transfer station does not comprise an actual support or holding means but is rather just the place where the wafer is directly delivered from the robot to the transport unit.

In yet another embodiment third linear track with associated transport unit can be arranged between the both parallel linear tracks. This middle transport unit can thus access process units of both arrays of process units.

The invention claimed is:
1. Apparatus (1) for treating wafer-shaped articles, comprising:
- a linear arranged process unit array of at least two process units (31, 33), wherein in each said process unit only and exactly one single wafer-shaped article (Wm) can be treated at one time;
- at least one cassette-holding unit (15), each cassette-holding unit for holding at least one cassette storing at least one wafer-shaped article therein;
- a transport system for picking a held wafer-shaped article from the one cassette and placing the thus picked-up wafer-shaped article into one of the process units, the transport system comprising
  i) at least one linear track (26) arranged parallel to the process unit array (31, 33), the track for moving the picked-up single wafer-shaped article along a linear path parallel to the process unit array, and
  ii) a transport unit (46) movably mounted on each of said at least one linear track (26), said transport unit comprising at least one holding means (46a) for holding the picked-up wafer-shaped article in a substantially vertical plane parallel to the linear track and moving the picked-up wafer-shaped article along a transport path defined by the linear track, wherein the transport unit (46) has a pivoting (66) mechanism for pivoting (P) the picked-up wafer-shaped article from a substantially vertical state to a substantially horizontal state to place the picked up wafer-shaped article in one of the process units;
- a front unit comprising
  i) an array of at least two of the cassette-holding units (15) for holding cassettes storing a plurality of the wafer-shaped articles, and
  ii) a transfer unit (84, 86) for transferring the wafer-shaped articles between the cassettes and the transport unit (46); and
- at least one transfer station (22) for temporarily storing the picked up wafer-shaped article (Wt),
- the transfer station being accessible by the transfer unit (84, 86) and by the transport unit (46) movably mounted on the linear track,
- wherein said transfer station further comprises a holding unit (42) with two holding devices (42a, 42b) arranged in a back-to-back configuration.

2. Apparatus as claimed in claim 1, wherein said transfer station (22) comprises a flip mechanism for flipping (Fv) the picked-up wafer-shaped article.

3. Apparatus as claimed in claim 1, with a transport system comprising at least two of said at least one linear tracks (24, 26).

4. Apparatus as claimed in claim 1, wherein,
- each process units (31, 33) treats the only exactly one single wafer-shaped article (Wm) in a horizontal position, and
- a transport path of the held wafer is narrower than a diameter of the held wafer.

* * * * *